United States Patent [19]
Jones, Jr.

[11] B 3,983,381
[45] Sept. 28, 1976

[54] DIGITAL AUTOMATIC GAIN CONTROL CIRCUIT

[75] Inventor: Gardner D. Jones, Jr., Raleigh, N.C.

[73] Assignee: International Business Machines Corporation, Armonk, N.Y.

[22] Filed: Dec. 18, 1974

[21] Appl. No.: 534,016

[44] Published under the second Trial Voluntary Protest Program on February 3, 1976 as document No. B 534,016.

[52] U.S. Cl. ............................... 235/154; 235/152
[51] Int. Cl.² ............................................ G06F 5/00
[58] Field of Search ................. 235/152, 154, 164; 325/38 R, 321; 178/68, 67, 66; 340/347 AD, 347 DA, 172.5, 15.5 GC, 15.5 DP

[56] References Cited
UNITED STATES PATENTS
3,562,504   2/1971   Harris ................................ 235/154

Primary Examiner—Charles D. Miller
Attorney, Agent, or Firm—John B. Frisone

[57] ABSTRACT

A digital automatic gain control circuit in which the input signal is multiplied by a gain control parameter whose value is generated in a feedback loop such that the resultant product has specified constant metric.

12 Claims, 8 Drawing Figures

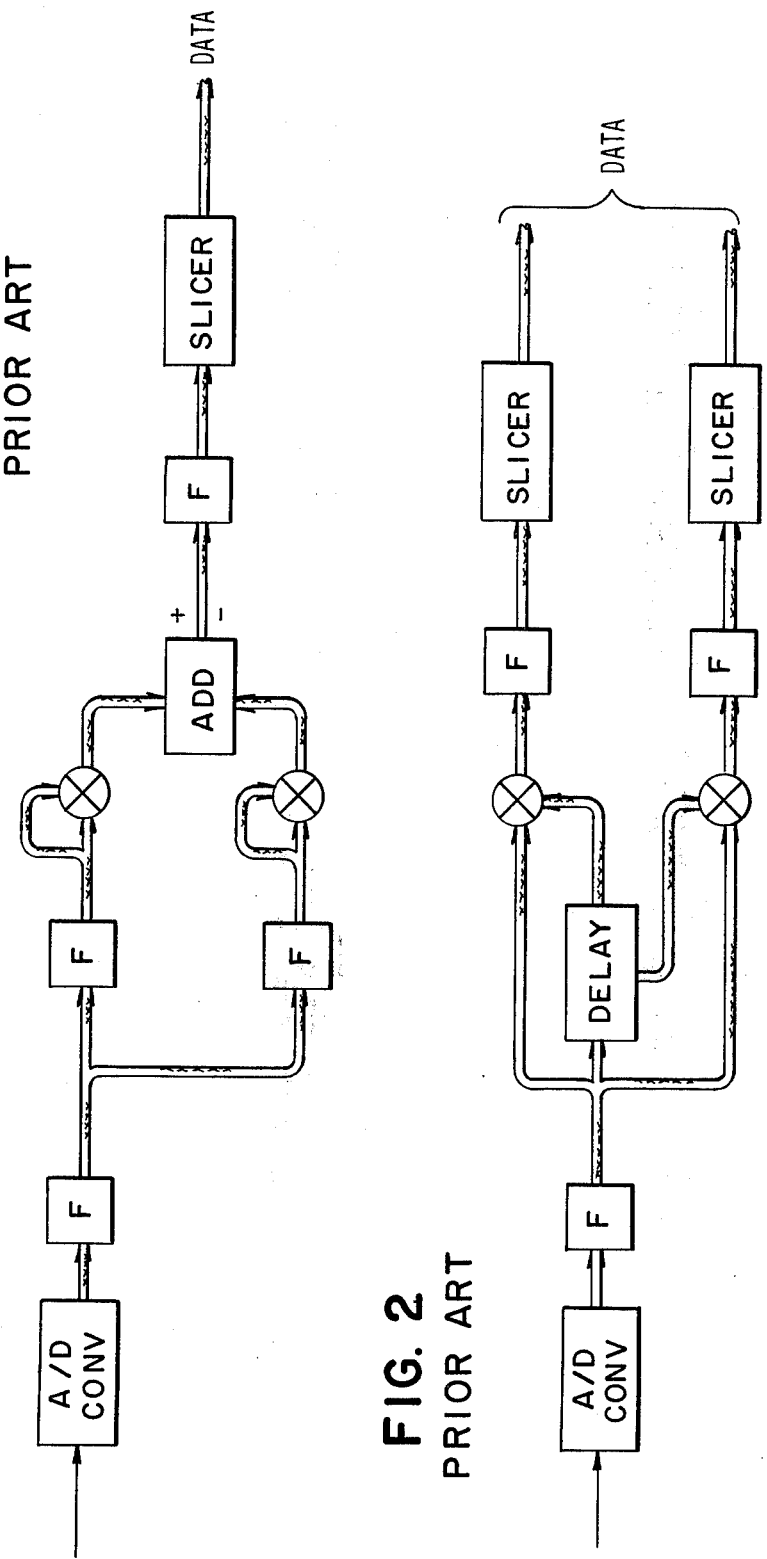

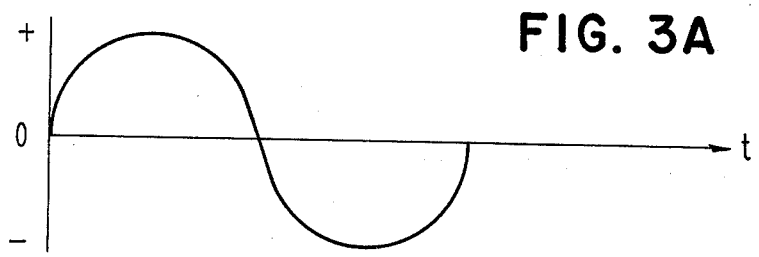
FIG. 3A (a)
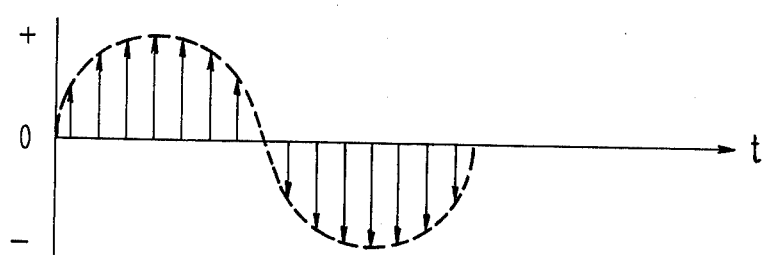
(b)
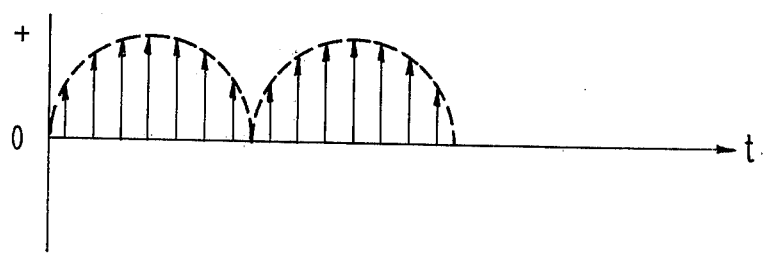
(c)
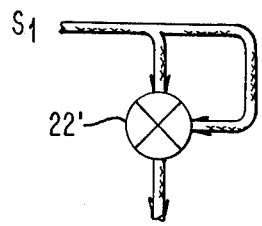
FIG. 3B

```
         ┌ 0 1 1 1 ------- 1 1 1 1 1 1 1    MOST (+) VALUE
+ VALUES │
         │
         └ 0 0 0 0 ------- 0 0 0 0 0 0 1    LEAST (+) VALUE 0 0 0 0 ------- 0 0 0 0 0 0 0    ZERO

┌ 1 1 1 1 ------- 1 1 1 1 1 1 1    LEAST (-) VALUE
- VALUES │
         │
         └ 1 0 0 0 ------- 0 0 0 0 0 0 0    MOST (-) VALUE
           ↑                     ↑
          SIGN                 LEAST
          BIT                SIGNIFICANT
                               BIT
```

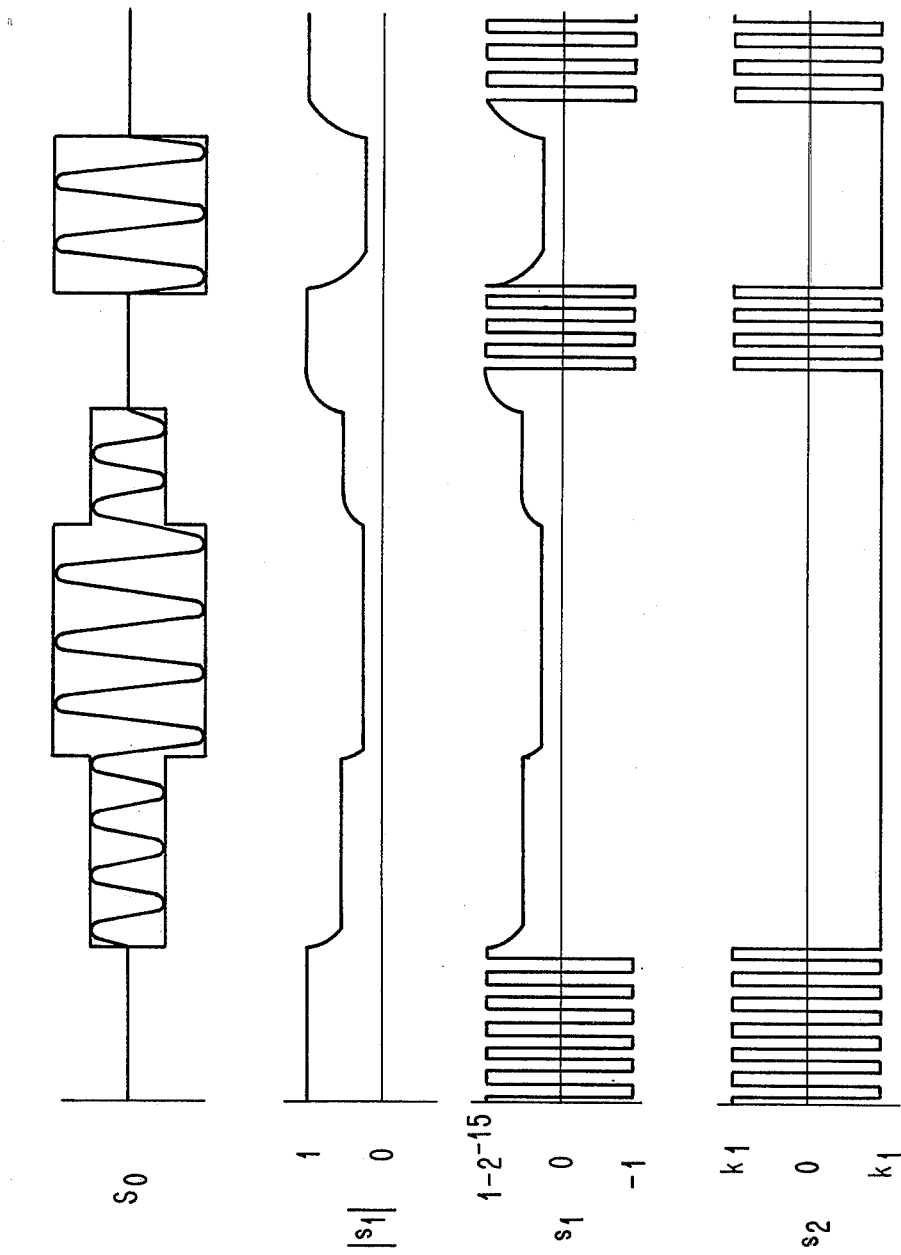

3,983,381

DIGITAL AUTOMATIC GAIN CONTROL CIRCUIT

FIELD OF THE INVENTION

The invention relates to digital signal processing and more particularly to a digital automatic gain control circuit suitable for use in data signal demodulators and other processing functions involving digitally coded analog signals.

DESCRIPTION OF THE PRIOR ART

In many instances, analog data signal processing systems or circuits have been replaced with digital data signal processing systems. The digital processing systems like the analog systems require, in many instances, the ability to normalize a signal within a particular range of levels. In analog systems this is done with automatic gain control circuits. FIGS. 1 and 2 illustrate two commonly used detectors implemented with digital filter techniques where automatic gain control is needed. FIG. 1 shows a square law FSK detector which is commonly used for detecting FSK modulated data signals in 1,200 bit per second range and below. FIG. 2 shows a detector which is commonly used for detecting DPSK modulated data signals in 2,000 to 2,400 bit per second range.

In both the FSK and DPSK detectors, the post detection signals vary as the square of the input line signal level. The input signal level, in practice, may vary over as much as a 35 db range and thus the post detection signals may vary by as much as 70 db in level. Many digital filtering devices in existence and being designed are limited, for economic reasons, to a sixteen bit word for representing the signal being processed. A digital filter thus limited does not have the capacity to process a signal having a 70 db range variation and provide sufficient signal to noise ratio to allow adequate performance in the circuit arrangements illustrated in FIGS. 1 and 2. An obvious solution to the problem is to increase the word size of the signal and the size of the digital filter to accommodate the increased word size. As stated previously, cost and technology considerations dictate against this choice. Another alternative, equally unacceptable, is to utilize prior art analog automatic gain control circuits or techniques prior to converting the analog signal to digital form. While this later technique is technically feasible, it is, however, economically unattractive in many applications. For example, in a digital time shared demodulator which is suitable for demodulating on a time sharing basis, a number of different signals on different lines, each line would require an individual AGC circuit which in many cases might not be required due to the nature of the received signal. This duplication of circuits and cost would in most cases negate the savings inherent in a time shared system. Ideally, a digital AGC operating subsequent to the analog to digital converter could time share many of the digital processing components and provide the gain control function at little or no additional cost.

One approach to providing a digital gain control would be to directly map one of the many available analog approaches into a digital implementation. However, this is not a viable approach since; (1) considerations relating to digital arithmetic, such as overflow, have no correspondence in analog circuits but do affect the actual configuration of a digital gain control; and (2) the desirable characteristics of having the loop transient response independent of the signal level is generally achieved in analog solutions by providing a logarithmic element in the gain control loop. In a digital implementation, the logarithmic function is not desirable since a table look up is required and is generally an expensive specialized requirement not otherwise used in general purpose digital signal processors.

SUMMARY OF THE INVENTION

The invention contemplates a digital gain control circuit suitable for use in a digital signal processor such as a digital demodulator and comprises a multiplier for forming the product of an input signal and a gain control signal, a feedback loop responsive to the output of the multiplier and a constant for generating the said gain control reference signal, said feedback loop including means for forming an error signal corresponding in magnitude and sign to the difference between the magnitude or the square of the magnitude of the multiplier output and the said first constant, accumulator means responsive to said error signal for generating said gain control signal, a secondary feedback loop responsive to the sign of the accumulator output for controlling the sign of the constant and another secondary feedback loop responsive to the gain control signal for modifying the magnitude of the error signal as a function of the gain control signal.

BRIEF DESCRIPTION OF THE DRAWINGS

FIG. 1 is a block diagram of a conventional prior art digital FSK demodulator;

FIG. 2 is a block diagram of a conventional prior art digital DPSK demodulator;

FIG. 3A is a graphical representation of the signals present at several points in FIG. 3;

FIG. 3B illustrates an alternative form for FIG. 3 to provide a RMS gain control in lieu of the average illustrated in FIG. 3;

FIG. 6 is a series of graphs illustrating equivalent analog signals at several points in the circuit;

DESCRIPTION OF THE PREFERRED EMBODIMENTS

Figure 3:
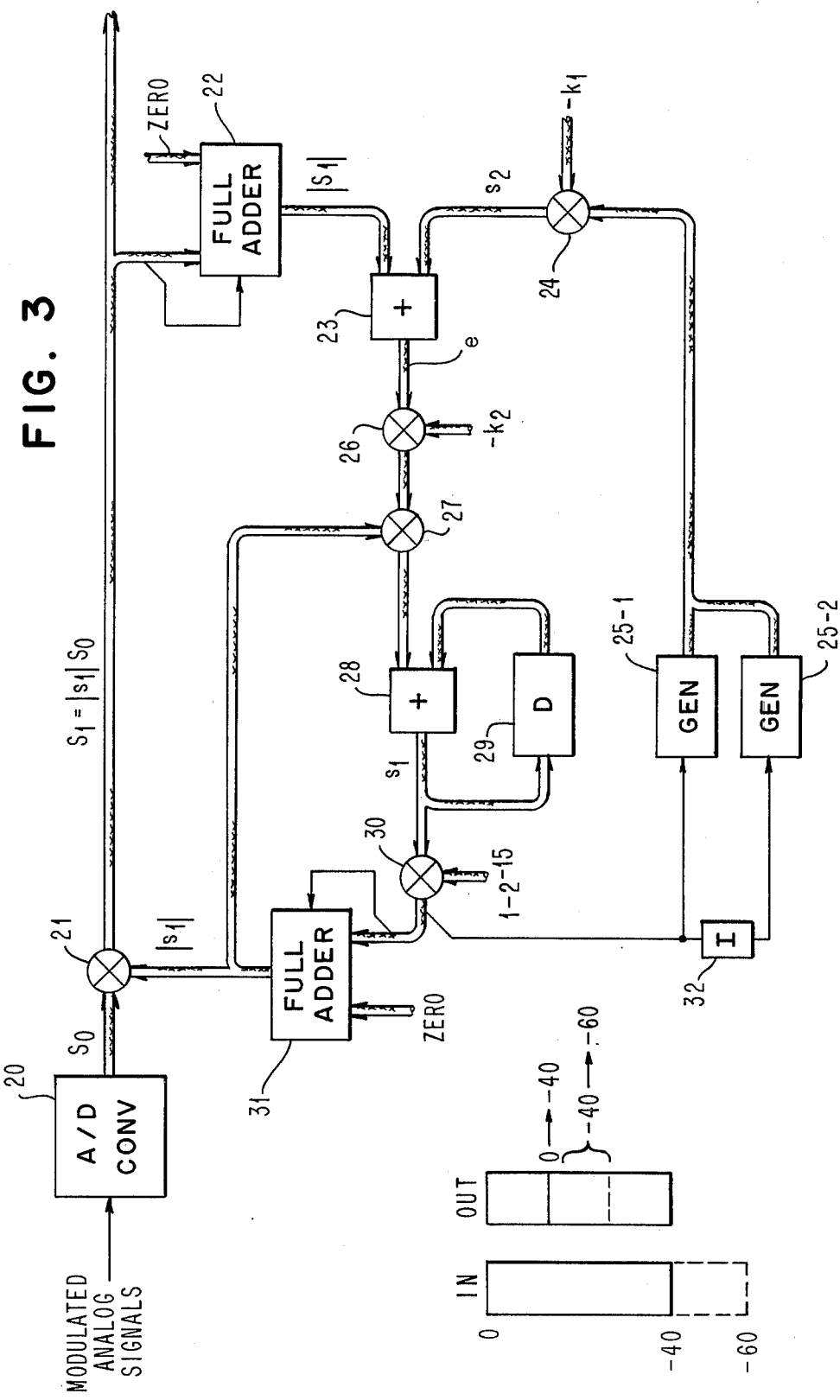
FIG. 3 is a block diagram of a novel digital gain control circuit constructed in accordance with the invention.

The modulated analog signals are applied to an analog to digital converter 20 of FIG. 3 which at some fixed sampling rate, preferably in the order of 8000 samples per second, samples the analog signal and provides a coded digital output indicative of the amplitude and sign of the signal at each of the sample times. These outputs may typically take the form illustrated in the table of FIG. 4 in which the high order bit, that is, the bit on the left is a sign bit and in which 0 indicates positive values and a 1 indicates negative values. The range of numbers from the most negative value will go from all zeroes progressively to all ones and switch to all zeroes again with a zero sign bit for a zero value and from a one in the low order bit with all zeroes to all ones except for the zero in the high order bit. The output $S_o$ from analog to digital converter 30 is applied to a 2's complement multiplier, such as a Booth multiplier, 21, where it is multiplied by a gain control signal $|s_1|$. Gain control signal $|s_1|$ is supplied from a feedback loop and the generation of this signal will be described as the description continues. The signal $s_1$ is magnitude only and thus no change in the sign of the signal $S_o$ will occur during the course of the multiplication in multiplier 21. The output of multiplier 21 is indicated in the drawing as $S_1$ and is equal to the product of $|s_1|$ and $S_o$. The signal $S_1$ constitutes the output signal for the digital automatic gain control circuit.

The signal $S_1$ is applied to a full adder circuit 22. All of the bits except for the sign bit are applied to one input of this adder. All zeroes is applied to the other input of adder 22. The sign bit is applied to the control input of adder 22 and controls whether or not the adder will perform an addition or a subtraction. If the sign bit is positive, that is, zero, the bits applied to the input of full adder 22 from the output of multiplier 21 will be passed through the adder unchanged. If the sign bit is a negative, that is, the sign bit is 1, the adder will provide an output equal to the magnitude of the difference between 0 and the number applied which is the sign inversion of the input in 2's complement representation. This in effect amounts to an invert of all of the bits of the number applied to the input of full adder 22 from multiplier 21 and the addition of a 1 bit at the least significant bit level. It has been assumed in the description thus far and in the description which follows that a sixteen bit number is used in the processing throughout the circuits. If a different number of bits are utilized, some of the circuits will require minor changes in the constants supplied thereto. This will become apparent as the description continues. The graphs shown in FIG. 3A indicate the processes described thus far. Graph A shows a sinusoidal analog signal. Graph B indicates the magnitude and sign of the digital values supplied by the A to D converter 20 and graph C indicates the rectification which takes place in those signals in the full adder circuit 22. Using the full adder 22 as illustrated and described above, the gain control will normalize the output signal to a level having a specified average value. A multiplier 22' as illustrated in FIG. 3B may be substituted for full adder 22 in which case normalization will be about the RMS value since multiplier 22' provides the square of the input signal $S_1$ at its output.

The magnitude of $|S_1|$ is applied to one input of an adder circuit 23. The other input of adder circuit 23 is derived from a multiplier 24 which is a product of a constant $-k_1$ and the output of one of two generators 25-1 or 25-2. Generator 25-1 provides an output signal which has a sign bit 0 and 15 one bits when selected as will be described hereinafter while generator 25-2 provides an output which has a negative sign bit which is a one and all the remaining bits are zero except for the lowest order bit which is a one. The output of generator 25-1 represents the largest positive value in the system while the output of generator 25-2 represents the next to largest negative value possible. The sign of the output of multiplier 24 will be negative if generator 25-1 provides the output for the input to the multiplier and positive if generator 25-2 provides the output. The magnitude of constant $k_1$ sets the gain level for the circuit and the selection of generators 25-1 and 25-2 provide for a search mode in the event no signal $S_1$ is present for an extended period of time. The selection process for generators 25-1 and 25-2 will be described subsequently.

The output of adder 23 is a measure of the deviation of the signal $S_1$ from the magnitude and sign of $k_1$ and is applied to one input of a multiplier circuit 26 which has a constant $-k_2$ applied to its other input. The magnitude of constant $k_2$ is selected to provide the overall sensitivity of the feedback loop while the sign is selected to cause the corrections of the gain control circuit to proceed in the proper direction. The output of multiplier 26 is applied to one input of another multiplier 27 which has its second input connected directly to the gain control signal $|s_1|$. This multiplication is performed to provide within the feedback loop the means for causing the correction factors to be a fixed percentage of the actual input signal thus correction and normalization occurs at the same rate regardless of the actual level of the input signal $S_o$. The output of multiplier 27 is applied to one input of an adder circuit 28. The output of adder circuit 28 is fed back through a delay circuit 29 to the second input of adder circuit 28 thus providing the sum or difference depending upon the sign of the signal in the delay circuit 29 and the sign of the signal from multiplier 27 of the current sample and the previous sample to provide an output signal $s_1$ including sign indicative of the change. The adder circuit 28 and delay circuit 29 form an accumulator which may be counted up and counted down as correction to the input signal $S_o$ are made and reflected in signal $S_1$.

The output of adder circuit 28 is also applied to one input of a two input multiplier 30. The constant in 2's complement form equal to $1 - 2^{-15}$ is applied to the other input of multiplier 30. The product of multiplier 30 in effect is the same number applied to the input $S_1$ multiplied by 1 minus the smallest quantity codable, thus preventing the negative values in the 2's complement code illustrated in FIG. 4 from changing by more than one value by the addition or subtraction of 1 in the lowest order position such as would occur in the rectification action provided by full adder 31. The output of multiplier 30 is applied to a second full adder 31 similar in all respects and operation to adder 22. The output of full adder 31 is magnitude of $S_1$ which is the gain control signal applied to multiplier 21 and multiplier 27 to control the sensitivity of the feedback loop when applied to that multiplier. In addition, the output of multiplier 30 is applied directly to generator 25-1 and selects generator 25-1 when the output of the multiplier is positive. It is also applied via an inverter 32 to generator 25-2 for selecting that generator when the sign of the output is negative. By selecting generator 25-1 when the sign of the output signal is positive and generator 25-2 when the sign of the signal from multiplier 30 is negative, a search is made in one of two positions. In those instances, where the signal $S_1$ magnitude falls to zero, the accumulator will flip from some positive value to some negative value back and forth searching until the signal $S_1$ appears at the input to adder 23 at which time normalization to the gain control level set by constant $k_1$ will be achieved. The two bar graphs in FIG. 3 illustrate the range of the input signal prior to the gain control circuit and the range of the output signal at the output of the gain control circuit. Signals between 0 and −40 db at the input are normalized to the output illustrated. These will be below the 0 db level. Signals between −40 db and −60 db will not normalize and will fall within the range illustrated at the output.

Figures 4, 5:
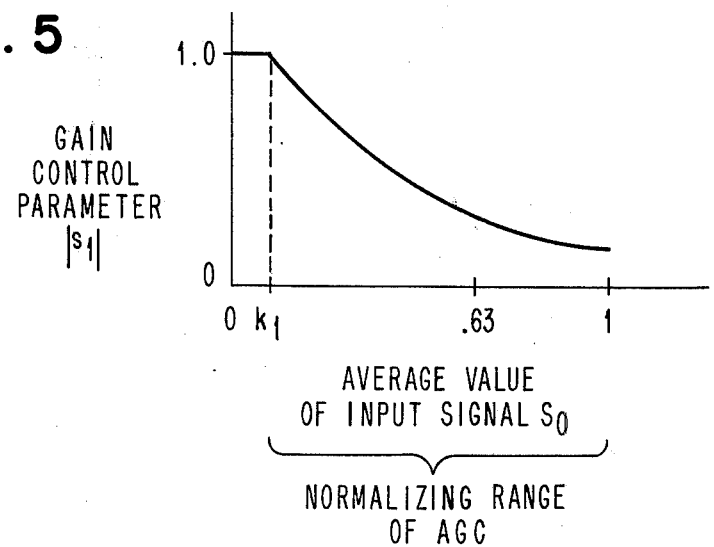
FIG. 4 is a table illustrating the form which the input signal to the gain control may take.
FIG. 5 is a graph illustrating the normalizing range of the gain control circuit.

FIG. 5 illustrates the gain control parameter $|s_1|$ versus the average value of the input signal and FIG. 6 illustrates the analog equivalent waveforms of the various signals described in connection with FIG. 3. The analog signal from the communication line is conventionally sampled and converted to a 9 bit 2's complement digital representation by A/D converter 20. The AGC circuit is implemented with digital functions (multiplier, adders, etc.) having a 16 bit word size. At the input to the AGC, the highest 9 bits of the 16 bit word contain the input signal. In the subsequent processing, a 16 bit word represents a signal in the range −1 to +1 range in a 2's complement code. The action of the AGC is to multiply the input signal $S_o$ by a gain control parameter $|s_1|$ or G where $G = |s_1|$ whose magnitude is such that the resultant product, $S_1$, has a specified constant metric. This metric is chosen to be the average value of the signal $S_1$ although an RMS metric as previously described, can be used if the absolute value of $S_1$ is replaced by its square.

Thus, the function of the control loop is to maintain the average value of $S_1$, the AGC output, at a constant value equal to the parameter $k_1$ as the average value of the input, $S_o$, varies over a large range. Since the input signal and subsequent signal points in the system are scaled in the range ± 1, the action of the AGC is to reduce $S_o$ to a lower level, normalized $S_1$. The control is accomplished by having the error between the average value of $S_1$ and the desired $k_1$ drive an accumulator (28, 29). The absolute value of the accumulator output is the gain control parameter, G. The action of the control loop is for the accumulator to change until a value of G is reached such that the average of $S_1$ is equal to $k_1$. The variation of G with input level is shown in FIG. 5. For a $k_1 = 0.01$, the loop can maintain a constant level output ($S_1$) as the input varies over a range of approximately 40db (36db for a sine wave input, i.e. from an average value of 0.01 to 0.63 since the input is scaled in the range ± 1). Since G is inversely proportional to the average level of the input signal, it can be quantified to a threshold and used for the carrier detection function for the digital modems using the receivers in FIGS. 1 and 2.

In FIG. 3, the actual error is formed by $S_1 \pm s_2$ where $s_2 = \pm k_1$ depending on the sign of the accumulator output. This is necessary because of the following: When the input drops below the controllable range (that is, the average value of $S_o$ is less than $k_1$), the sign of $s_2$ dominates the sign of the error, causing the control loop to run open loop. The accumulator is driven in one direction, and its output $s_1$ overflows. By changing the sign of $s_2$ with the sign of $s_1$, the accumulator is made to oscillate directly between the maximum ± values without transversing the intermediate range between ± 1 as would occur if the search loop (25-1, 25-2, 32 and 24) were not used. Since the absolute value of the accumulator output is used as the gain control G, the ± oscillation is seen as a constant ±1 value for G which allows the AGC to relinquish control over the input signal in a smooth and continuous manner. For accuracy's sake, it should be noted that although the scaling range is referred to as ± 1, it is actually $+ (1 - 2^{-15})$ and −1 for a 16 bit 2's complement code. This small error obviously creates no accuracy problem in normally linear operations; however, if the absolute value of −1 is ever taken, no corresponding +1 exists and a serious error results. To avoid this problem in taking the absolute value of the accumulator output, $s_1$ is multiplied by $1 - 2^{-15}$ so that this is the magnitude of the largest negative number and is rectifiable.

In FIG. 3, the error signal $e$ (output of adder 23) is multiplied by $-k_2$ before application to the accumulator. The parameter $k_2$ determines the rate at which the loop can respond to an error change and effectively determine the amount of averaging of the error. The response loop (multiplier 27) is used so that the transient response of the AGC control will be independent of signal level. This can be seen as follows. Assuming the loop is stabilized when the input signal is changed by an amount $\Delta S_o$ the rate at which the gain is adjusted to this new condition (that is, the rate at which G is changed) is given by the level of input to the accumulator which is $$k_2 \, G \, \Delta \, S_o$$

However, G is inversely proportional to the average level of the input $S_o$ before the change. The rate of response of the AGC is then $$K = k_2 \, \frac{\Delta S_o}{S_o}$$

This relationship shows that the transient response is dependent on the relative level change rather than the absolute magnitude. That is, a 10% change in level will produce the same transient response over the entire range of control afforded by the AGC. This has been shown to be an important characteristic in analog AGC's and is one of the reasons that many such approaches have logaritmic characteristics in their control loops.

The logarithmic response characteristic of the digital AGC can be seen as follows: The change in gain, $\Delta G$, during a processing period, $\Delta t$, is $$\Delta G = G k_2 e$$

where $e$ is the control loop error signal. The term $\Delta t$ is the reciprocal of the sampling rate, $f_s$, at which digital signal samples enter the AGC. The rate in time at which G changes is $$\frac{\Delta G}{\Delta t} = G \, \frac{k_2 e}{\Delta t}$$

Assuming the sampling rate is sufficiently high relative to the bandwidth of the input signal then $$\frac{dG}{dt} = G \, k_2 \, \frac{G1e}{\Delta t}$$

$$\frac{1}{G} \, \frac{dG}{dt} = k_2 \, \frac{e}{\Delta t}$$

$$\frac{1}{\log_{10} E} \, \frac{d}{dt} [\log_{10} G] = k_2 \, \frac{e}{\Delta t}$$

$$\frac{d}{dt} [20 \log_{10} G] = [20 \log_{10} E] \, \frac{e}{\Delta t} k_2$$

Using $t = 1/f_s$ then $$\frac{d}{dt} [G_{db}] = 8.7 \, k_2 f_s \, e$$

Thus $k_2$ can be chosen for the desired relationship between the error signal and the gain rate in units of db per second. It is noted that when a strong signal is suddenly reduced in amplitude the gain recovery rate in d b/s. is given by the right side of the above equation with $e = k_1$.

The characteristics provided by the response loop are required when processing signals which have large envelope variations. Examples are signals used for multi-tone (parallel tone) transmission and speech. For signals with relatively constant envelopes, such as FSK and DPSK signals, the response loop may not be required. In this case, multiplier 27 is not used and the input to the adder 28 is just $ek_2$.

While the invention has been particularly shown and described with reference to preferred embodiments thereof, it will be understood by those skilled in the art that various changes in form and detail may be made therein without departing from the spirit and scope of the invention.

What is claimed is:

1. A digital gain control circuit suitable for use in a digital signal processor such as a digital demodulator comprising:
   a multiplier for forming the product of an uncontrolled digital input signal and a digital gain control signal;
   a feedback loop responsive to the magnitude of the output of the said multiplier and a digital reference for generating the said digital gain control signal;
   said feedback loop including;
   means for forming an error signal corresponding in magnitude and sign to the difference between the magnitude of the multiplier output and the said reference;
   accumulator means responsive to said error signal for generating said gain control signal; and
   a feedback control loop responsive to the sign of the accumulator output for modifying the sign of the reference to cause said error signal to assume alternate negative and positive fixed values when the multiplier output falls to zero for a predetermined period of time.

2. A digital gain control circuit as set forth in claim 1 in which said means for forming an error signal corresponding in magnitude and sign to the difference between the magnitude of the multiplier output and the said reference includes:
   adder means for forming the algebraic sum of the multiplier output and the output of the said feedback control loop;
   a second multiplier responsive to the output of said adder means and a second constant for adjusting the error signal magnitude and sign and providing an output for the said accumulator; and
   said accumulator includes, an adder having one input connected to receive the signal from said second multiplier, a delay circuit connected between the output of the adder and another input whereby the output of the second multiplier is accumulated, a third multiplier connected to the adder output and a constant which is substantially equal to one, and means for converting the third multiplier output to positive magnitudes regardless of sign.

3. A digital gain control circuit as set forth in claim 2 in which said feedback control loop includes:
   means responsive to the sign of the output of the third multiplier for providing a first digital value for one sign and a second digital value for the other sign; and
   a fourth multiplier responsive to said first or second digital value as selected by the sign and a constant for providing the said digital reference.

4. A digital gain control circuit suitable for use in a digital signal processor such as a digital demodulator comprising:
   a multiplier for forming the product of an uncontrolled digital input signal and a digital gain control signal;
   a feedback loop responsive to the square of the output of the said multiplier and a digital reference for generating the said digital gain control signal;
   said feedback loop including;
   means for forming an error signal corresponding in magnitude and sign to the difference between the square of the multiplier output and the said reference;
   accumulator means responsive to said error signal for generating said gain control signal, and
   a feedback control loop responsive to the sign of the accumulator output for modifying the sign of the reference to cause said error signal to assume alternate negative and positive fixed values when the square of the multiplier output falls to zero for a predetermined period of time.

5. A digital gain control circuit as set forth in claim 4 in which said means for forming an error signal corresponding in magnitude and sign to the difference between the square of the multiplier output and the said reference includes:
   adder means for forming the algebraic sum of the square of the multiplier output and the output of the said feedback control loop;
   a second multiplier responsive to the output of said adder means and a second constant for adjusting the error signal magnitude and sign and providing an output for the said accumulator; and
   said accumulator includes, an adder having one input connected to receive the signal from said second multiplier, a delay circuit connected between the output of the adder and another input whereby the output of the second multiplier is accumulated, a third multiplier connected to the adder output and a constant which is substantially equal to one, and means for converting the third multiplier output to positive magnitudes regardless of sign.

6. A digital gain control circuit as set forth in claim 5 in which said feedback control loop includes:
   means responsive to the sign of the output of the third multiplier for providing a first digital value for one sign and a second digital value for the other sign; and
   a fourth multiplier responsive to said first or second digital value as selected by the sign and a constant for providing the said digital reference.

7. A digital gain control circuit suitable for use in a digital signal processor such as a digital demodulator comprising:
   a multiplier for forming the product of an uncontrolled digital input signal and a digital gain control signal;
   a feedback loop responsive to the output of said multiplier and a digital reference for generating the said gain control signal;
   said loop including:
   means for forming an error signal corresponding in magnitude and sign to the difference between the magnitude of the multiplier output and the said reference,
   accumulator means responsive to said error signal for generating said gain control signal,
   a first feedback control loop responsive to the sign of the accumulator output for modifying the sign of the reference to cause said error signal to assume alternate negative and positive fixed values when the multiplier output falls to zero for a predetermined period of time; and a second feedback control loop responsive to the gain control signal for changing the sensitivity of the feedback loop as a function of the gain control signal.

8. A digital gain control circuit as set forth in claim 7 in which said means for forming an error signal corresponding in magnitude and sign to the difference between the magnitude of the multiplier output and the said reference includes:

adder means for forming the algebraic sum of the multiplier output and the output of the said feedback control loop;

a second multiplier responsive to the output of said adder means and a second constant for adjusting the error signal magnitude and sign and providing an output for the said accumulator;

a third multiplier responsive to the said gain control signal and said second multiplier output for modifying the output of the second multiplier and sensitivity of the feedback loop as a function of the gain control signal; and said accumulator includes an adder having one input connected to receive the signal from said third multiplier, a delay circuit connected between the output of the adder and another input whereby the output of the third multiplier is accumulated, a fourth multiplier connected to the adder output and a constant which is substantially equal to one, and means for converting the fourth multiplier output to positive magnitudes regardless of sign.

9. A digital gain control circuit as set forth in claim 8 in which said feedback control loop includes:

means responsive to the sign of the output of the fourth multiplier for providing a first digital value for one sign and a second digital value for the other sign; and a fifth multiplier responsive to said first or second digital value as selected by the sign and a constant for providing the said digital reference.

10. A digital gain control circuit suitable for use in a digital signal processor such as a digital demodulator comprising:

a multiplier for forming the product of an uncontrolled digital input signal and a digital gain control signal;

a feedback loop responsive to the output of said multiplier and a digital reference for generating the said gain control signal;

said loop including:

means for forming an error signal corresponding in magnitude and sign to the difference between the square of the multiplier output and the said reference, accumulator means responsive to said error signal for generating said gain control signal, a first feedback control loop responsive to the sign of the accumulator output for modifying the sign of the reference to cause said error signal to assume alternate negative and positive fixed values when the square of the multiplier output falls to zero for a predetermined period of time; and a second feedback control loop responsive to the gain control signal for changing the sensitivity of the feedback loop as a function of the gain control signal.

11. A digital gain control circuit as set forth in claim 10 in which said means for forming an error signal corresponding in magnitude and sign to the difference between the square of the multiplier output and the said reference includes:

adder means for forming the algebraic sum of the square of the multiplier output and the output of the said feedback control loop;

a second multiplier responsive to the output of said adder means and a second constant for adjusting the error signal magnitude and sign and providing an output for the said accumulator;

a third multiplier responsive to the said gain control signal and said second multiplier output for modifying the output of the second multiplier and the sensitivity of the feedback loop as a function of the gain control signal; and said accumulator includes an adder having one input connected to receive the signal from said third multiplier, a delay circuit connected between the output of the adder and another input whereby the output of the third multiplier is accumulated, a fourth multiplier connected to the adder output and a constant which is substantially equal to one, and means for converting the fourth multiplier output to positive magnitudes regardless of sign.

12. A digital gain control circuit as set forth in claim 11 in which said feedback control loop includes:

means responsive to the sign of the output of the fourth multiplier for providing a first digital value for one sign and a second digital value for the other sign; and a fifth multiplier responsive to said first or second digital value as selected by the sign and a constant for providing the said digital reference.

* * * * *